(12) United States Patent
Jiang et al.

(10) Patent No.: US 8,431,936 B2
(45) Date of Patent: Apr. 30, 2013

(54) METHOD FOR FABRICATING A P-TYPE SEMICONDUCTOR STRUCTURE

(75) Inventors: Fengyi Jiang, Jiang Xi (CN); Li Wang, Jiang Xi (CN); Wenqing Fang, Jiang Xi (CN); Chunlan Mo, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 385 days.

(21) Appl. No.: 11/841,116

(22) Filed: Aug. 20, 2007

(65) Prior Publication Data

US 2008/0315212 A1 Dec. 25, 2008

(30) Foreign Application Priority Data

Jun. 22, 2007 (CN) .......................... 2007 1 0112585

(51) Int. Cl.
*H01L 29/26* (2006.01)
*H01L 29/06* (2006.01)

(52) U.S. Cl.
USPC ................. 257/79; 257/13; 257/103; 257/88; 257/E33.025; 257/E33.03

(58) Field of Classification Search ............. 257/13, 257/79, E51.018, E33.001, E33.025, E25.019, 257/88, E33.023, E33.03, 94, 103, 43, E33.031
See application file for complete search history.

(56) References Cited

U.S. PATENT DOCUMENTS

| | | | |
|---|---|---|---|
| 5,959,401 A * | 9/1999 | Asami et al. | 313/503 |
| 6,172,382 B1 * | 1/2001 | Nagahama et al. | 257/94 |
| 6,337,493 B1 * | 1/2002 | Tanizawa et al. | 257/79 |
| 6,906,352 B2 | 6/2005 | Edmond | |
| 7,078,256 B2 | 7/2006 | Ryu | |
| 7,372,081 B2 | 5/2008 | Song | |
| 2003/0010993 A1 * | 1/2003 | Nakamura et al. | 257/99 |
| 2005/0145860 A1 * | 7/2005 | Tanizawa | 257/85 |
| 2007/0096077 A1 * | 5/2007 | Sanga et al. | 257/13 |

* cited by examiner

*Primary Examiner* — Lynne Gurley
*Assistant Examiner* — Galina Yushina
(74) *Attorney, Agent, or Firm* — Shun Yao; Park, Vaughan, Fleming & Dowler LLP

(57) ABSTRACT

One embodiment of the present invention provides a method for fabricating a group III-V p-type nitride structure. The method comprises growing a first layer of p-type group III-V material with a first acceptor density in a first growing environment. The method further comprises growing a second layer of p-type group III-V material, which is thicker than the first layer and which has a second acceptor density, on top of the first layer in a second growing environment. In addition, the method comprises growing a third layer of p-type group III-V material, which is thinner than the second layer and which has a third acceptor density, on top of the second layer in a third growing environment.

12 Claims, 1 Drawing Sheet

METHOD FOR FABRICATING A P-TYPE SEMICONDUCTOR STRUCTURE

RELATED APPLICATION

This application hereby claims priority under 35 U.S.C. §119 to the following foreign patent application: China Patent Application No. 200710112585.6, filed 22 Jun. 2007.

BACKGROUND

1. Field of the Invention

The present invention relates to the design of semiconductor light-emitting devices. More specifically, the present invention relates to a technique for epitaxially growing p-type nitride semiconductor material and a method for fabricating semiconductor light-emitting devices using such p-type nitride semiconductor material.

2. Related Art

Group III-V nitride semiconductor materials, including compounds (e.g. GaN, InN, and AlN) and alloys (e.g. AlGaN, InGaN, and AlGAInN), are widely used in the manufacturing of short-wavelength light-emitting devices such as light-emitting diodes and laser diodes, as well as the manufacturing of high frequency electronics. The demand for high-brightness light-emitting diodes (HB-LEDs) using group III-V compound semiconductor materials has grown significantly over the years. HB-LEDs have a wide range of uses in the photonic industry, solid state electronic devices, automotive lighting systems, and other applications.

A P-N junction is an essential structure in the fabricating of light-emitting devices. When forward-bias is applied to a light-emitting device, the carriers, namely holes from the p-type layer and electrons from the n-type layer, recombine in the P-N junction region and thus energy is released in the form of photons. An active region formed by a multi-quantum well (MQW) structure between the p-type layer and the n-type layer facilitates a higher carrier density and hence an increased recombining rate of the carriers, which can improve light-emitting efficiency.

Techniques for epitaxially growing an LED structure with group III-V nitride materials include metalorganic chemical vapor deposition (MOCVD), molecular beam epitaxial (MBE), and Hydride Vapor Phase Epitaxy (HVPE). Substrate materials used for epitaxial growth include sapphire ($AL_2O_3$), silicon, and silicon carbide (SiC).

When Si and magnesium (Mg) are used as the donor and acceptor dopants respectively for fabricating group III-V nitride materials, it is relatively easy to obtain high carrier density in n-type nitride materials. However, this is not the case for p-type nitride materials.

During the fabrication of a p-type nitride material, hydrogen ($H_2$) is often used as the carrier gas to increase the density of the acceptor, which is often Mg. However, $H_2$ and Mg can form an electrically inactive Mg—H complex, which reduces doping efficiency. As a result, a Mg-doped p-type nitride layer might have fewer activated acceptors than one doped with other materials.

To overcome the problem described above and to obtain a low resistivity p-type nitride layer, low-energy electron beam irradiation (LEEBI) and/or an annealing treatment in a $H_2$-free environment can be employed after the growth of the p-type nitride layer. These additional processes break down the Mg—H complex and electrically activate the acceptor. However, the p-type nitride layer has to be relatively thin so that these additional processes can be effective.

On the other hand, having a relatively thick layer of p-type nitride material can improve the quality and reliability of the LED. Growing a high-quality, thick p-type nitride layer often requires a high temperature environment and growth for a prolonged period of time. However, such prolonged high-temperature growth can damage the adjacent quantum-well active region and thus reduce the efficacy of the carrier activation process. Consequently, the number of activated acceptors decreases, and so does the efficiency of the light-emitting device.

Hence, what is needed is a method for growing a relatively thick p-type nitride layer that has a high carrier density without compromising the quality of an adjacent MQW region.

SUMMARY

One embodiment of the present invention provides a method for fabricating a group III-V p-type nitride structure. The method comprises growing a first layer of p-type group III-V material with a first acceptor density in a first growing environment. The method further comprises growing a second layer of p-type group III-V material, which is thicker than the first layer and which has a second acceptor density, on top of the first layer in a second growing environment. In addition, the method comprises growing a third layer of p-type group III-V material, which is thinner than the second layer and which has a third acceptor density, on top of the second layer in a third growing environment.

In a variation of this embodiment, the first growing environment for the first layer of p-type group III-V material includes $H_2$ as a carrier gas.

In a variation of this embodiment, the growing temperature in the first growing environment is equal to or higher than 900° C.

In a variation of this embodiment, the first layer of p-type group III-V material has an acceptor density equal to or higher than $1\times10^{19}$ cm$^{-3}$.

In a variation of this embodiment, the growing time for the first layer of p-type group III-V material is less than or equal to 1,000 seconds.

In a variation of this embodiment, the second growing environment for the second layer of p-type group III-V material includes $N_2$ as a carrier gas.

In a variation of this embodiment, the growing temperature in the second growing environment is at least 30° C. lower than that in the first growing environment.

In a variation of this embodiment, the thickness of the second layer of p-type group III-V material is at least 500 Å.

In a variation of this embodiment, the growing time for the second layer of p-type group III-V material is at least 1.5 times that for the first layer of p-type group III-V material.

In a variation of this embodiment, the third growing environment for the third layer of p-type group III-V material includes $H_2$ as a carrier gas.

In a variation of this embodiment, the growing temperature in the third growing environment is at least 30° C. higher than that in the second growing environment.

In a variation of this embodiment, the third layer of p-type group III-V material has an acceptor density equal to or higher than $1\times10^{19}$ cm$^{-3}$.

In a variation of this embodiment, the growing time for the third of p-type group III-V material is less than or equal to half that for the second layer of p-type group III-V material.

In a variation of this embodiment, growing the first, second, and third layers comprises doping the corresponding material with one or more dopants selected from a group consisted of Mg, Zn, and C.

In a variation of this embodiment, growing the first, second, and third layers comprises depositing one or more elements selected from a group consisted of Al, Ga, and IN.

In a variation of this embodiment, growing the first, second, and third layers comprises depositing one or more elements selected from a group consisted of N, P, and As.

One embodiment of the present invention provides a semiconductor light-emitting device that includes a layer of substrate material selected from a group consisted of $AL_2O_3$, silicon, and SiC. The semiconductor light-emitting device further includes a layer of n-type nitride material, an active-region layer, a first layer of p-type nitride material with a first acceptor density and a low lattice mismatch with the active-region layer, a second layer of p-type nitride material that is thicker than the first layer of p-type nitride material and has a second acceptor density, a third layer of p-type nitride material that is thinner than the second layer of p-type nitride material and has a third acceptor density, and an ohmic-contact layer on the third layer of p-type nitride material.

In a variation of this embodiment, the first layer of p-type nitride material is grown in an environment using $H_2$ as a carrier gas.

In a variation of this embodiment, the first layer of p-type nitride material is grown in an environment with a growing temperature equal to or higher than 900° C.

In a variation of this embodiment, the first layer of p-type nitride material has an acceptor density equal to or higher than $1 \times 10^{19}$ cm$^{-3}$.

In a variation of this embodiment, the growing time for the first layer of p-type group III-V material is less than or equal to 1,000 seconds.

In a variation of this embodiment, the second layer of p-type nitride material is grown in an environment using $N_2$ as a carrier gas.

In a variation of this embodiment, the second layer of p-type nitride material is grown in an environment with a growing temperature at least 30° C. lower than that for the first layer of p-type nitride material.

In a variation of this embodiment, the second layer of p-type nitride material has a thickness of at least 500 Å.

In a variation of this embodiment, the second layer of p-type nitride material is grown for at least 1.5 times that for the first layer of p-type nitride material.

In a variation of this embodiment, the third layer of p-type nitride material is grown in an environment using $H_2$ as a carrier gas.

In a variation of this embodiment, the third layer of p-type nitride semiconductor material is grown in an environment with a growing temperature at least 30° C. higher than the growing temperature for the second layer of p-type nitride semiconductor material In a variation of this embodiment, the third layer of p-type nitride material has an acceptor density equal to or higher than $1 \times 10^{19}$ cm$^{-3}$.

In a variation of this embodiment, the third layer of p-type nitride material is grown for less than half of the growing time for the second layer.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention provide a method for growing a high-quality p-type nitride semiconductor structure that has a high carrier density without sacrificing the quality of an adjacent MQW active region. Light-emitting devices based on the p-type nitride semiconductor material manufactured in accordance with one embodiment of the present invention are more reliable and have higher luminous efficiency than those based on other materials.

In one embodiment, the dopant materials used to manufacture a p-type nitride semiconductor structure include Mg, Zn, and C. These materials increase the carrier density in p-type semiconductor materials. Group III-V compound semiconductors comprise group III materials such as Al, Ga, and In, and group V materials such as N, P, and As.

Figure 1:
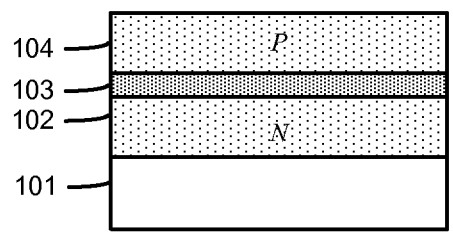
FIG. 1 illustrates a cross-sectional view of a conventional epitaxial structure of a light-emitting device.

FIG. 1 depicts a conventional epitaxial structure of a light-emitting device using a p-type nitride semiconductor material. The structure comprises a substrate 101, a layer of n-type semiconductor material 102, an active region 103, and a layer of p-type semiconductor material 104. Typically, p-type layer 104 is grown in an ambient temperature that is approximately 100° C. or less lower than the ambient temperature for n-type layer 102. The growing environment for p-type layer 104 includes the use of $H_2$ gas as the carrier gas to increase the density of acceptor dopant, such as Mg. However, p-type layer 104 is rather thin, which results in limited reliability and a low breakdown voltage (minimum reverse voltage).

Figure 2:
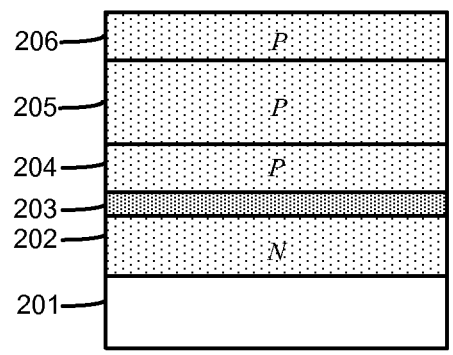
FIG. 2 illustrates a cross-sectional view of an epitaxial structure of a light-emitting device using a p-type nitride semiconductor material manufactured in accordance with one embodiment of the present invention.

FIG. 2 shows an epitaxial structure of a light-emitting device using a p-type nitride semiconductor material manufactured in accordance with one embodiment of the present invention. In one embodiment, a structure of p-type semiconductor material comprises three separately grown layers of p-type semiconductor material 204, 205, and 206. The rest of the LED structure includes a substrate layer 201, an n-type layer 202, and an MQW active-region layer 203.

P-type layer 204 is grown on top of active region 203 in the first stage. P-type layer 205 is thicker than layer 204 and is sandwiched between layer 204 and layer 206. Layer 205 is grown in the second stage. Subsequently, p-type layer 206 which is thinner than layer 205 and which provides an ohmic contact for the light-emitting device is grown in the third stage.

Compared with layer 205, p-type layer 204 is grown for a relatively short period of time in an environment where $H_2$ is used as the carrier gas in a relatively high temperature.

Because p-type layer 204 is adjacent to active-region layer 203, it can benefit from a high acceptor density and high-quality crystal structure. Growth in high temperature and using $H_2$ as the carrier gas can result in a good crystal structure, which reduces lattice mismatch with adjacent MQW active-region layer 203. Furthermore, growing layer 204 in $H_2$ with a high temperature increases the carrier density and hence the luminous efficiency. Such growth also improves device reliability. Therefore, the high-temperature $H_2$ growth environment can improve the electrical and optical properties of a light-emitting device.

Although high-temperature growth improves the crystal quality of p-type layer 204, the high temperature can also damage materials that form the MQW structure (e.g. nitride alloy containing In). When MQW active-region layer 203 is exposed to such high temperature for a prolonged period, the luminous efficiency of the device can suffer. Therefore, in one embodiment, p-type layer 204 is grown in a high temperature only for a short period of time.

Luminous efficiency also depends on carrier density. Using $H_2$ as the carrier gas increases the acceptor density in a p-type layer. However, $H_2$ and typical acceptor dopant materials, such as Mg and Zn, can form a complex, which passivates the acceptors and reduces light emission efficiency.

To mitigate the $H_2$ passivation effect, p-type layer 205, which is thicker than p-type layer 204, is grown for a longer period in an environment where $N_2$ is used as the carrier gas in a temperature that is at least 30° C. lower than that used for p-type layer 204. The growing time for p-type layer 205 is at least 1.5 times that for p-type layer 204. Note that, because p-type layer 205 is not immediately adjacent to MQW active-region layer 203, the acceptor density requirement for p-type layer 205 is not as critical as that for p-type layer 204, and neither is the crystal quality requirement for p-type layer 205.

Since p-type layer 205 is thicker than p-type layer 204, conventional methods for disassociating hydrogen from the acceptor dopant and activating the acceptors (e.g. annealing, thermal treatment, and low-energy electron beam irradiation) are less effective. Using $N_2$ as the carrier gas in the fabricating of p-type layer 205 effectively removes hydrogen from p-type layer 204 through diffusion, activates the acceptors, and increases the density of the carriers in p-type layer 204.

P-type layer 206 is grown for a shorter period of time in an environment where $H_2$ is used as the carrier gas in a temperature that is at least 30° C. higher than that used for p-type layer 205. P-type layer 206 exhibits a high carrier density and high crystal quality due to the use of $H_2$ and high growth temperature. P-type layer 206 facilitates the subsequent fabrication of an ohmic-contact layer which is formed by using metal evaporation or other techniques. In order to facilitate the manufacturing of the ohmic contact layer, p-type layer 206 ideally has higher hole density than layer 205. Using $H_2$ as the carrier gas increases the acceptor density.

The aforementioned multi-stage fabrication method produces a p-type semiconductor structure with high carrier density and high activation efficiency. In particular, this method facilitates growth of a thick p-type nitride structure without degrading the crystal structure of the MQW active region. Therefore, light-emitting devices manufactured with the disclosed multi-stage method are reliable and yield high luminous efficacy.

Figure 3:
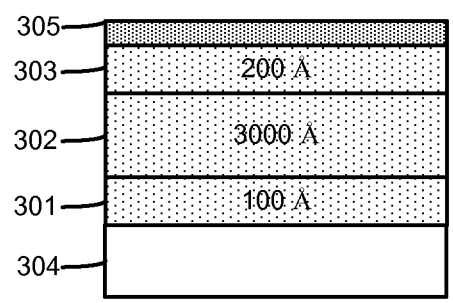
FIG. 3 illustrates an exemplary p-type nitride semiconductor structure manufactured in accordance with one embodiment of the present invention.

FIG. 3 is an exemplary p-type nitride semiconductor structure manufactured in accordance with one embodiment of the present invention. The structure comprises an MQW active-region layer 304, an ohmic-contact layer 305, and three layers of p-type semiconductor material 301, 302, and 303.

P-type layer 301 is grown in an environment where $H_2$ is used as the carrier gas in a temperature of approximately 950° C. A growing time of approximately 200 seconds is sufficient for the growth of p-type layer 301 whose thickness is 100 Å. The relatively short growing time ensures that MQW active-region layer 304 is not damaged when exposed to the high temperature. Using $H_2$ as the carrier gas allows a higher carrier density. In one embodiment, the acceptor dopant in layer 301 is at least $2\times10^{19}$ cm$^{-3}$.

P-type layer 302 is grown in an environment where $N_2$ is used as the carrier gas in a temperature of approximately 850° C. The growing time is sufficient for the growth of p-type layer 302 whose thickness is 3000 Å. In one embodiment, the growth time for p-type layer 302 is approximately 2000 seconds. Growing p-type layer 302 in a lower temperature for a longer period results in a thicker p-type layer without damaging the MQW structure in the active region. Using $N_2$ as the carrier gas allows hydrogen in layer 301 to diffuse into p-type layer 302, thereby facilitating the disassociation of hydrogen from the hydrogen-dopant complex in layer 301 which passivates the acceptor dopants in p-type layer 301. Consequently, the acceptors, which in one embodiment are Mg atoms, can be electrically activated more effectively during the activation process and the carrier density in the p-type material close to the active region can be increased.

P-type layer 303 is grown in an environment where $H_2$ is used as the carrier gas in a temperature of approximately 950° C. The growing time is sufficient for the growth of p-type layer 303 whose thickness is 200 Å. In one embodiment, the growth time for p-type layer 303 is approximately 100-200 seconds. In one embodiment, the acceptor density is at least $2\times10^{19}$ cm$^{-3}$. Using $H_2$ as the carrier gas increases carrier density and facilitates the formation of low-resistance, reliable ohmic-contact layer 305 on top of p-type layer 303 using materials such as Pt and/or Au.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the claims.

What is claimed is:

1. A semiconductor light-emitting device, comprising:
    a layer of substrate material selected from a group consisting of $Al_2O_3$, Si, and SiC;
    a layer of n-type nitride material;
    an active-region layer;
    a first p-type layer consisting of doped GaN situated above the active-region layer, wherein the first p-type layer has a first acceptor density and a low lattice mismatch with the active-region layer;
    a second p-type layer consisting of doped GaN situated above and in direct contact with the first p-type layer, wherein the second p-type layer is thicker than the first p-type layer, wherein a thickness of the second p-type layer is greater than 100 nm, and wherein the second p-type layer has a second acceptor density;
    a third p-type layer consisting of doped GaN situated above and in direct contact with the second p-type layer, wherein the third p-type layer is thinner than the second p-type layer, wherein the third p-type layer has a third acceptor density, and wherein the third acceptor density is substantially the same as the first acceptor density; and
    an ohmic-contact layer situated above the third p-type layer.

2. The light-emitting device of claim 1, wherein the first p-type layer is grown in an environment using $H_2$ as a carrier gas.

3. The light-emitting device of claim 1, wherein the first p-type layer is grown in an environment with a growing temperature equal to or higher than 900° C.

4. The light-emitting device of claim 1, wherein the first p-type layer has an acceptor density equal to or higher than $1 \times 10^{19}$ cm$^{-3}$.

5. The light-emitting device of claim 1, wherein the growing time for the first p-type layer is less than or equal to 1,000 seconds.

6. The light-emitting device of claim 1, wherein the second p-type layer is grown in an environment using $N_2$ as a carrier gas.

7. The light-emitting device of claim 1, wherein the second p-type layer is grown in an environment with a growing temperature at least 30° C. lower than that for the first p-type layer.

8. The light-emitting device of claim 1, wherein a growing time for the second p-type layer is at least 1.5 times of that for the first p-type layer.

9. The light-emitting device of claim 1, wherein the third p-type layer is grown in an environment using $H_2$ as a carrier gas.

10. The light-emitting device of claim 1, wherein the third p-type layer is grown in an environment with a growing temperature at least 30° C. higher than that for the second p-type layer.

11. The light-emitting device of claim 1, wherein the third p-type layer has an acceptor density equal to or higher than $1 \times 10^{19}$ cm$^{-3}$.

12. The light-emitting device of claim 1, wherein the third p-type layer is grown for less than or equal to half of the growing time for the second p-type layer.

* * * * *